United States Patent
Li (10) Patent No.: US 12,216,979 B2
(45) Date of Patent: Feb. 4, 2025

(54) METHOD FOR CORRECTING MASK PATTERN, APPARATUS FOR CORRECTING MASK PATTERN AND METHOD FOR MANUFACTURING SEMICONDUCTOR DEVICE

(71) Applicant: CHANGXIN MEMORY TECHNOLOGIES, INC., Hefei (CN)

(72) Inventor: Shuping Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 531 days.

(21) Appl. No.: 17/647,730

(22) Filed: Jan. 11, 2022

(65) Prior Publication Data

US 2022/0382142 A1    Dec. 1, 2022

Related U.S. Application Data

(63) Continuation of application No. PCT/CN2021/110608, filed on Aug. 4, 2021.

(30) Foreign Application Priority Data

May 31, 2021    (CN) .......................... 202110605120.4

(51) Int. Cl.
*G06F 30/30*    (2020.01)
*G03F 1/36*    (2012.01)
(Continued)

(52) U.S. Cl.
CPC .............. *G06F 30/398* (2020.01); *G03F 1/36* (2013.01); *G03F 1/44* (2013.01); *G03F 7/70441* (2013.01)

(58) Field of Classification Search
None
See application file for complete search history.

(56) References Cited

U.S. PATENT DOCUMENTS 6,136,478 A    10/2000   Usui et al.
6,622,296 B2*   9/2003   Hashimoto .............. G03F 1/36
                                                      430/5

(Continued)

FOREIGN PATENT DOCUMENTS

CN        1383188 A      12/2002
CN      101060110 A      10/2007
(Continued)

OTHER PUBLICATIONS

International Search Report in Application No. PCT/CN2021/110608, mailed on Mar. 1, 2022.

*Primary Examiner* — Leigh M Garbowski
(74) *Attorney, Agent, or Firm* — Syncoda LLC; Feng Ma (57) ABSTRACT

A method for correcting a mask patter includes: acquiring an initial pattern of a mask, the initial pattern including a scribe line area and die areas which are spaced, and the scribe line area is located between two adjacent die areas, each of the die areas includes at least one die sub-area and at least one first sub-test element group (TEG) area, and the scribe line area includes scribe line sub-areas and second sub-TEG areas, the first sub-TEG area and the second sub-TEG area are adjacent to each other, and the first sub-TEG area and the second sub-TEG area constitute a TEG area; performing an optical proximity correction (OPC) on an area of the initial pattern excluding TEG areas, so as to acquire a final pattern.

19 Claims, 8 Drawing Sheets

```
┌─────────────────────────────────────────────┐
│  an initial pattern of a mask is acquired,  │
│  the initial pattern including a scribe     │
│  line area and die areas which are spaced,  │
│  and the scribe line area is located        │
│  between two adjacent die areas, each of    │
│  the die areas includes at least one die    │
│  sub-area and at least one first sub-test   │         S101
│  element group (TEG) area, and the scribe   │
│  line area includes scribe line sub-areas   │
│  and second sub-TEG areas, the first        │
│  sub-TEG area and the second sub-TEG area   │
│  are adjacent to each other, and the        │
│  first sub-TEG area and the second sub-TEG  │
│  area constitute a TEG area;                │
└─────────────────────────────────────────────┘
                      │
                      ▼
┌─────────────────────────────────────────────┐
│  an optical proximity correction is         │
│  performed on an area of the initial        │         S102
│  pattern excluding TEG areas, so as to      │
│  acquire a final pattern.                   │
└─────────────────────────────────────────────┘
```

(51) Int. Cl.
    *G03F 1/44*     (2012.01)
    *G03F 7/00*     (2006.01)
    *G06F 30/398*     (2020.01)

(56) References Cited

U.S. PATENT DOCUMENTS

| | | | |
|---|---|---|---|
| 7,176,486 B2 * | 2/2007 | Nasuno | H01L 22/34 |
| | | | 438/18 |
| 2005/0139826 A1 | 6/2005 | Nasuno et al. | |
| 2010/0167190 A1 | 7/2010 | Takahata et al. | |

FOREIGN PATENT DOCUMENTS

| | | |
|---|---|---|
| CN | 106599388 B | 8/2019 |
| CN | 109698140 B | 10/2020 |

\* cited by examiner

FIG. 5 generating a script for the optical proximity correction, wherein the script has a function of identifying a boundary of each of the TEG areas and not performing the optical proximity correction on each of the TEG areas;

performing the optical proximity correction on the initial pattern by the script, so as to acquire the final pattern.

FIG. 6 decomposing the initial pattern into a plurality of first correction areas and a plurality of second correction areas by the script, wherein each of the plurality of first correction areas comprises the die sub-area, each of the plurality of second correction areas comprises the scribe line sub-area, and each of the plurality of first correction areas and each of the plurality of second correction areas do not overlap;

↓ separately performing the optical proximity correction on the plurality of first correction areas and the plurality of second correction areas;

↓ matching and merging a plurality of corrected first correction areas with a plurality of corrected second correction areas to acquire the final pattern.

FIG. 7 testing whether an overlap length of a boundary of each of a plurality of merged first correction areas and a boundary of each of a plurality of merged second correction areas correspondingly is greater than or equal to a predetermined length;

↓ determining mergings succeed on a condition that the overlap length is greater than or equal to the predetermined length.

METHOD FOR CORRECTING MASK PATTERN, APPARATUS FOR CORRECTING MASK PATTERN AND METHOD FOR MANUFACTURING SEMICONDUCTOR DEVICE

CROSS-REFERENCE TO RELATED APPLICATIONS

The present application is a continuation of International Patent Application No. PCT/CN2021/110608 filed on Aug. 4, 2021, which claims priority to Chinese Patent Application No. 202110605120.4 filed on May 31, 2021. The disclosures of the above-referenced applications are incorporated herein by reference in their entirety.

BACKGROUND

When a mask is designed in an early stage of manufacturing, a pattern on the mask requires optical proximity correction (OPC) for some layers.

The above information disclosed in the background is merely used to enhance understanding of the background art of the art described in the specification. Therefore, the background art can include some information that does not form the prior art for a person of ordinary skill in the art.

SUMMARY

The disclosure relates to the field of semiconductors, in particular to a method for correcting a mask pattern, an apparatus for correcting a mask pattern, a computer readable storage medium, a processor, an electronic device and a method for manufacturing a semiconductor device.

A main objective of the disclosure is to provide a method for correcting a mask pattern, an apparatus for correcting a mask pattern, a computer readable storage medium, a processor, an electronic device and a method for manufacturing a semiconductor device, which solve a problem of a slit on a mask produced after an optical proximity correction (OPC).

According to one aspect of an embodiment of the disclosure, the method for correcting the mask pattern is provided. The method includes: an initial pattern of a mask is acquired, the initial pattern including a scribe line area and die areas which are spaced, and the scribe line area is located between two adjacent die areas, each of the die areas includes at least one die sub-area and at least one first sub-test element group (TEG) area, and the scribe line area includes scribe line sub-areas and second sub-TEG areas, the first sub-TEG area and the second sub-TEG area are adjacent to each other, and the first sub-TEG area and the second sub-TEG area constitute a TEG area; and an optical proximity correction on an area of the initial pattern excluding TEG areas is performed, so as to acquire a final pattern.

According to another aspect of the embodiment of the disclosure, the apparatus for correcting the mask pattern is further provided. The apparatus includes: an acquisition unit and a correction unit, and the acquisition unit is used for acquiring an initial pattern of a mask, the initial pattern including a scribe line area and die areas which are spaced, and the scribe line area is located between two adjacent die areas, each of the die areas includes at least one die sub-area and at least one first sub-test element group (TEG) area, and the scribe line area includes scribe line sub-areas and second sub-TEG areas, the first sub-TEG area and the second sub-TEG area are adjacent to each other, and the first sub-TEG area and the second sub-TEG area constitute a TEG area; and the correction unit is used for performing an optical proximity correction on an area of the initial pattern excluding TEG areas, so as to acquire a final pattern.

According to another aspect of the embodiment of the disclosure, a computer readable storage medium is further provided, the computer readable storage medium including a stored program, and the program executes any one of said method.

According to another aspect of the embodiment of the disclosure, a processor is further provided, the processor is used for running a program, and the program executes any one of said method.

According to another aspect of the embodiment of the disclosure, an electronic device is further provided, which includes one or more processors, a memory, and one or more programs, and the one or more programs are stored in the memory and configured to be executed by the one or more processors, and the one or more programs are used for executing any said method.

According to another aspect of the embodiment of the disclosure, a method for manufacturing a semiconductor device is further provided. The method includes: a wafer to be processed is provided, and a structural layer of a surface of the wafer to be processed is a photoresist layer; a mask is placed on the photoresist layer to acquire a component to be exposed, where a pattern of the mask is acquired by any one of the methods; the component to be exposed is exposed; and an exposed wafer is developed.

BRIEF DESCRIPTION OF THE DRAWINGS

Accompanying drawings of the specification which constitute a portion of the disclosure are used for providing further understanding of the disclosure. Schematic embodiments of the disclosure and descriptions thereof are used to explain the disclosure, but not constitute an improper limit to the disclosure. In the accompanying drawings.

The accompanying drawings above include the following reference numerals:

100. scribe line area; 101. test element group (TEG) area; 102. die area; 103. slit; 104. die sub-area; 105. scribe line sub-area; 106. first sub-TEG area; 107. second sub-TEG area; 108. first seal ring area; and 109. second seal ring area.

DETAILED DESCRIPTION

It should be noted that embodiments in the disclosure and features in the embodiments can be combined mutually if there is no conflict. The following will describe the disclosure in detail with reference to the accompanying drawings and in conjunction with the embodiments.

In order to enable a person of ordinary skill in the art to better understand solutions of the disclosure, the following clearly and completely describes the technical solutions in the embodiments of the disclosure with reference to the accompanying drawings in the embodiments of the disclosure. Apparently, the described embodiments are some rather than all of the embodiments of the disclosure. All other embodiments obtained by a person of ordinary skill in the art based on the described embodiments of the disclosure without creative efforts shall fall within the protection scope of the disclosure.

It should be noted that the terms "first", "second", etc. in the specification and claims of the disclosure and the above accompanying drawings are used to distinguish similar objects, but are not necessarily used to describe a specific sequence or a precedence order. It should be understood that the data used in this way can be interchanged under appropriate circumstances for the purposes of the embodiments of the disclosure described herein. In addition, terms "including", "having", and any variations thereof are intended to cover non-exclusive inclusions, for example, processes, methods, systems, products, or devices that include a series of steps or units need not be limited to those clearly listed steps or units, but can include other steps or units not explicitly listed or inherent to the processes, methods, products, or devices.

It should be understood that when an element (such as a layer, a film, an area, or a substrate) is described as being "on" another element, the element can be directly on another element, or an intermediate element can also exist. Furthermore, in the specification and claims, when it is described that an element is "connected" to another element, the element can be "directly connected" to another element or "connected" to the another element through a third element.

For the convenience of description, partial nouns or terms related to the embodiments of the disclosure are described below:

OPC is short for optical proximity correction, and a pattern on a mask is projected onto a photoresist through an exposure system. Due to an imperfection and a diffraction effect of an optical system, a pattern on the photoresist is not completely consistent with the pattern on the mask. The optical proximity correction is to correct the pattern on the mask by a calculation method.

Figure 1:
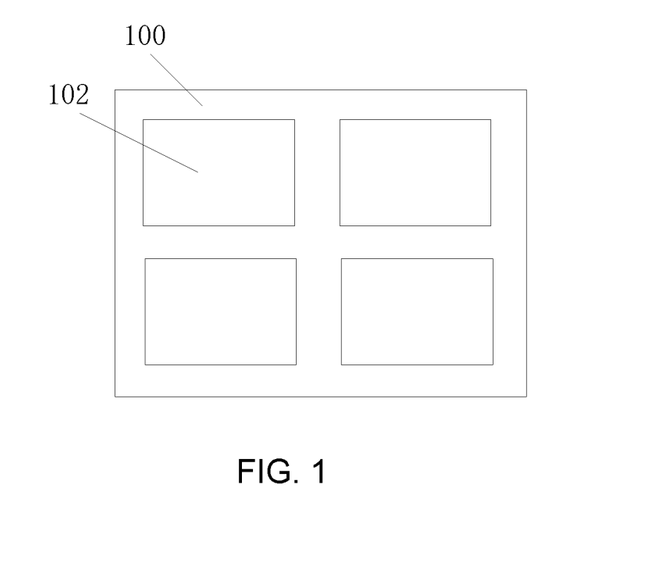
FIG. 1 shows a schematic diagram of a pattern of a mask in some implementations.

As shown in FIG. 1, the pattern on the mask includes a die area 102 and a scribe line area 100. The die area 102 and the scribe line area 100 are separated firstly for OPC, and then the die area and the scribe line area 100 which are subjected to the OPC are merged. However, as shown in FIG. 2, there will be a slit 103 at a joint between the scribe line area 100 and the die area 102 which are merged, and therefore quality of the mask and subsequent exposure effect will be affected by a slit pattern.

Figure 2:
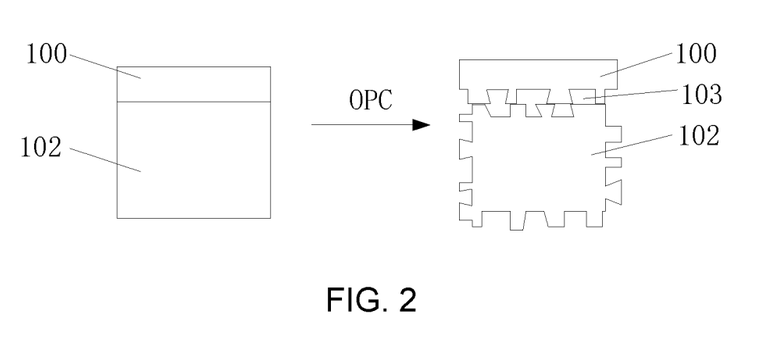
FIG. 2 shows a schematic diagram of performing an optical proximity correction (OPC) on the pattern of the mask in some implementations.

As such, a slit is produced on a mask after the OPC in the implementations of FIG. 1 and FIG. 2. To solve the problem, an exemplary embodiment of the disclosure provides a method for correcting a mask pattern, an apparatus for correcting a mask pattern, a computer readable storage medium, a processor, an electronic device and a method for manufacturing a semiconductor device.

According to the embodiment of the disclosure, the method for correcting the mask pattern is provided.

Figure 3:
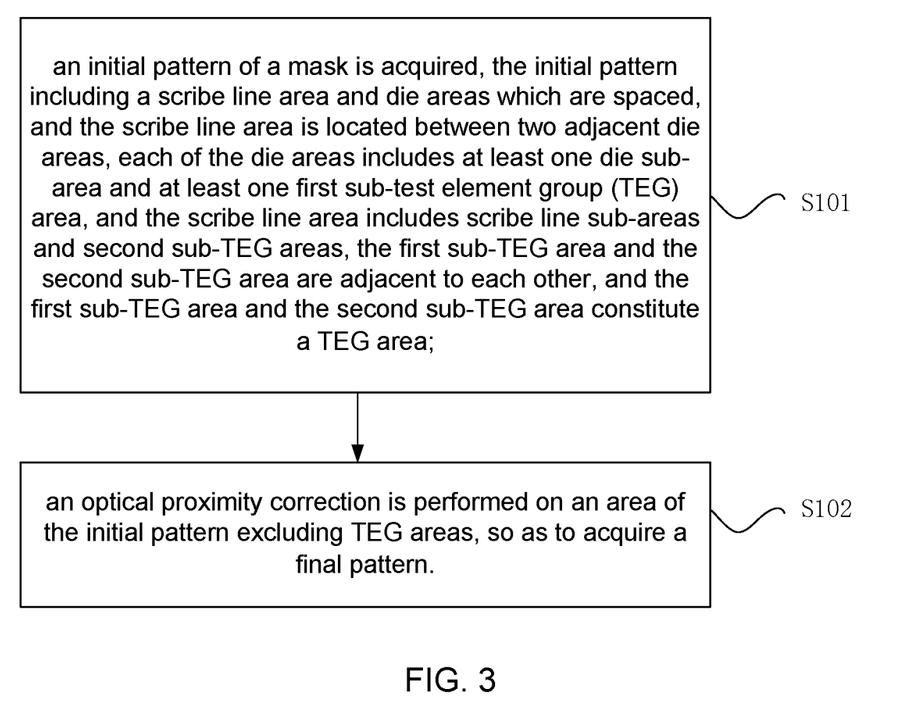
FIG. 3 shows a schematic flowchart of a method for correcting a mask pattern according to an embodiment of the disclosure.
Figure 4:
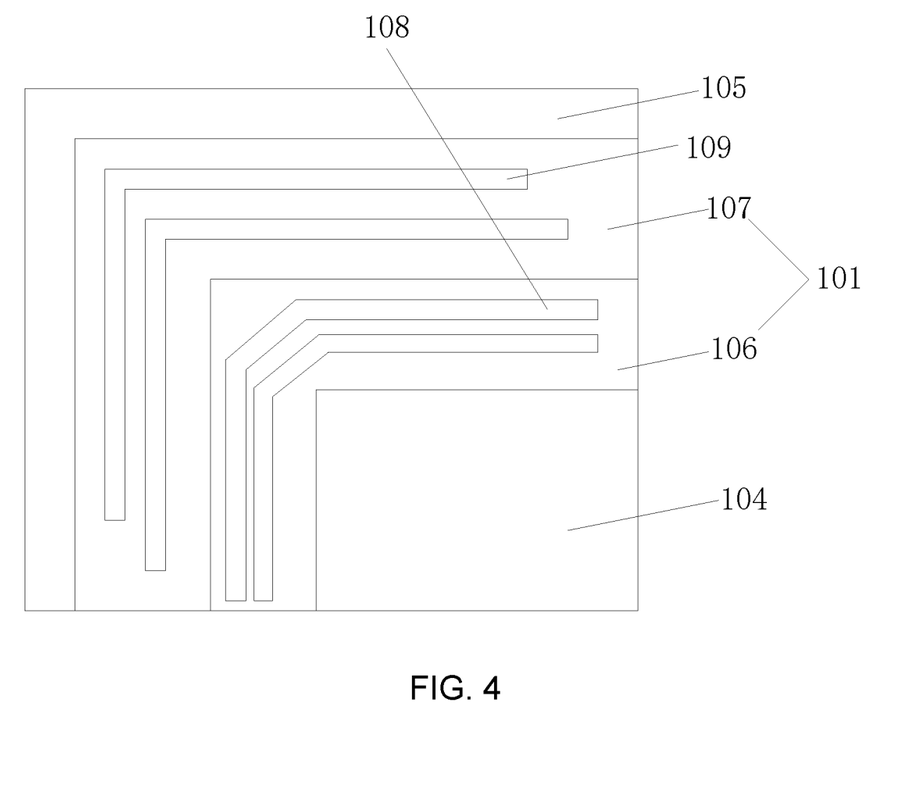
FIG. 4 shows a schematic diagram of an initial pattern of the mask according to an embodiment of the disclosure.

FIG. 3 is a flowchart of the method for correcting the mask pattern according to an embodiment of the disclosure. As shown in FIG. 3, the method includes:

S101, an initial pattern of a mask is acquired, as shown in FIG. 4, the initial pattern including a scribe line area 100 and die areas 102 which are spaced, and the scribe line area 100 is located between two adjacent die areas 102, each of the die areas 102 includes at least one die sub-area 104 and at least one first sub-test element group (TEG) area 106, and the scribe line area 100 includes scribe line sub-areas 105 and second sub-TEG areas 107, the first sub-TEG area 106 and the second sub-TEG area 107 are adjacent to each other, and the first sub-TEG area 106 and the second sub-TEG area 107 constitute a TEG area 101; and S102, an optical proximity correction is performed on an area of the initial pattern excluding TEG areas 101, so as to acquire a final pattern.

In the method for correcting the mask pattern, the initial pattern of the mask is firstly acquired, the initial pattern includes the scribe line area and the die areas which are spaced, and the scribe line area is located between the two adjacent die areas, each of the die areas includes the die sub-area and the first sub-TEG area, and the scribe line area includes the scribe line sub-area and the second sub-TEG area, the first sub-TEG area and the second sub-TEG area are adjacent to each other, and the first sub-TEG area and the second sub-TEG area constitute the TEG area, that is, the TEG area is separately adjacent to the die sub-area and the scribe line sub-area; and then the optical proximity correction is performed on the area of the initial pattern excluding the TEG areas, so as to acquire the final pattern. Compared with the implementations in which the OPC is separately performed on the die area and a frame, and then the die area and the frame which are subjected to the OPC are merged, which causes the problem that a joint between a merged scribe line and a merged die area has a slit, the method of the disclosure does not perform the OPC on the TEG areas between die sub-areas and the scribe line sub-areas during the OPC on the initial pattern, such that extra polygon edges of corrected die sub-areas, and extra polygon edges of corrected scribe line sub-areas can both extend to the TEG areas, thus ensuring that the final pattern acquired after the OPC will be free of a slit, avoiding a problem of the slit on the mask produced after the OPC, and ensuring that the final pattern has a desirable effect, thereby ensuring that a photoresist pattern acquired after exposing and developing a wafer according to the final pattern has a desirable effect.

It should be noted that the scribe line area corresponds to a scribe line position on a wafer to be photoetched, the die area corresponds to a die position on the wafer, and the TEG area corresponds to a TEG pattern position on the wafer.

During an actual application, there are a large number of patterns needing the OPC in the die sub-area and the scribe line sub-area.

Figure 6:
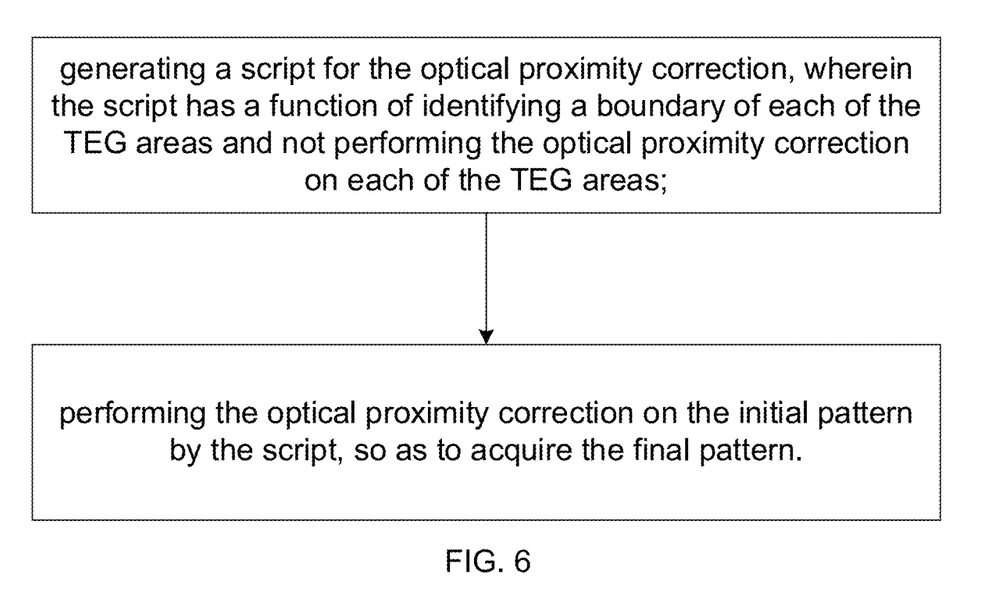
FIG. 6 shows a schematic flowchart of a method for correcting a mask pattern according to an embodiment of the disclosure.

In order to further ensure performing the optical proximity correction on the area of the initial pattern excluding the TEG areas simply and effectively, according to a specific embodiment of the disclosure, as shown in FIG. 6, the optical proximity correction is performed on the area in the initial pattern excluding the TEG areas includes: a script for the optical proximity correction is generated, and the script has a function of identifying a boundary of each of the TEG areas and not performing the optical proximity correction on each of the TEG areas; and the optical proximity correction is performed on the initial pattern by the script, so as to acquire the final pattern. Through the script operation, the method further ensures that the TEG areas are not corrected when the optical proximity correction is performed on the initial pattern, thereby further ensuring that the final pattern is free of the slit.

Figure 7:
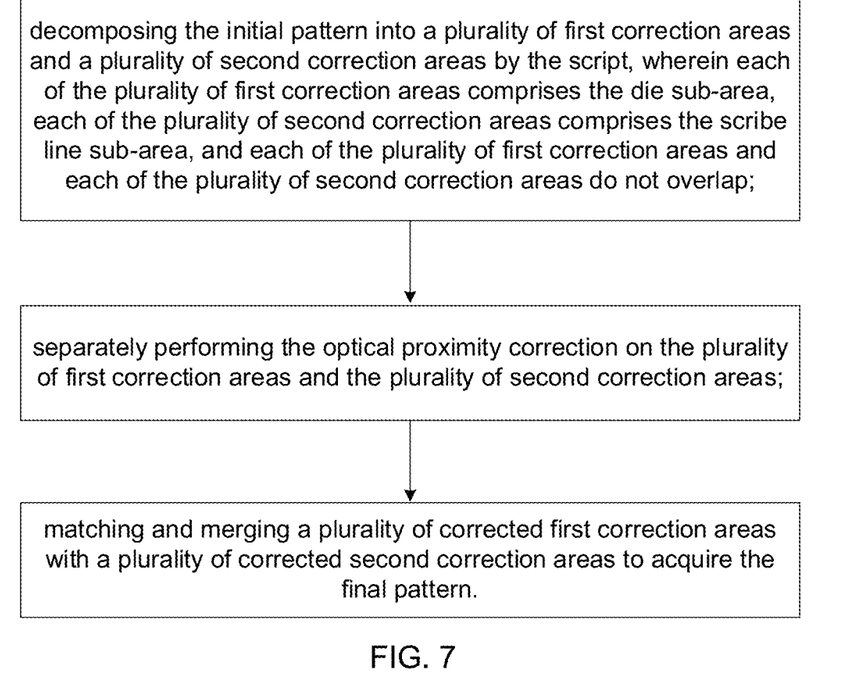
FIG. 7 shows a schematic flowchart of a method for correcting a mask pattern according to an embodiment of the disclosure.

In another specific embodiment of the disclosure, as shown in FIG. 7, the optical proximity correction is performed on the initial pattern by the script, so as to acquire the final pattern includes: the initial pattern is decomposed into a plurality of first correction areas and a plurality of second correction areas by the script, and each of the plurality of first correction areas includes the die sub-area, each of the plurality of second correction areas includes the scribe line sub-area, and each of the plurality of first correction areas and each of the plurality of second correction areas do not overlap; the optical proximity correction on the plurality of first correction areas and the plurality of second correction areas are performed separately; and a plurality of corrected first correction areas are matched and merged with a plurality of corrected second correction areas to acquire the final pattern.

During the actual application, a method of the optical proximity correction on the initial pattern is not limited to the method above, and a person of ordinary skill in the art can also use any feasible optical proximity correction method in the art to correct the initial pattern as long as the TEG areas of the initial pattern are not corrected.

Figure 8:
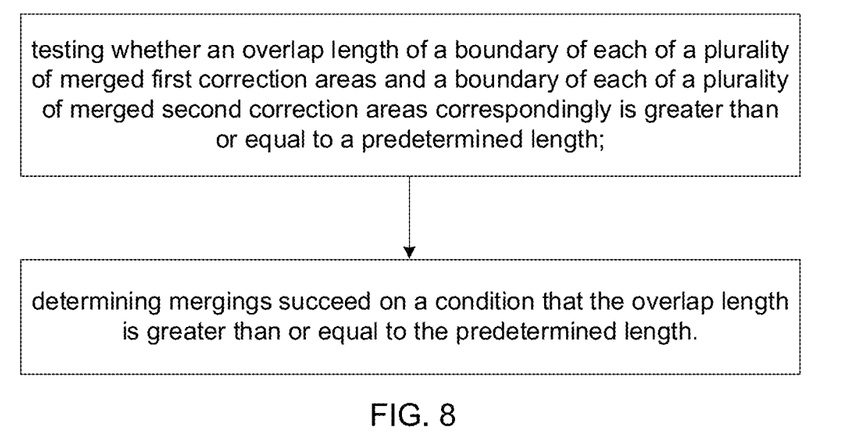
FIG. 8 shows a schematic flowchart of a method for correcting a mask pattern according to an embodiment of the disclosure.

In yet another specific embodiment of the disclosure, as shown in FIG. 8, after the plurality of corrected first correction areas are matched and merged with the plurality of corrected second correction areas, the method further includes: whether an overlap length of a boundary of each of a plurality of merged first correction areas and a boundary of each of a plurality of merged second correction areas correspondingly is tested to be greater than or equal to a predetermined length; and mergings are determined succeed on a condition that the overlap length is greater than or equal to the predetermined length. According to the method, by testing the overlap length of the boundary of each of the plurality of merged first correction areas and the boundary of each of the plurality of merged second correction areas correspondingly, merging effects of the plurality of corrected first correction areas and the plurality of corrected second correction areas are further monitored.

According to still another specific embodiment of the disclosure, the initial pattern further includes a plurality of seal ring areas, the plurality of seal ring areas are located in the TEG areas. The plurality of seal ring areas protect the die sub-areas and the scribe line sub-areas.

During the actual application, as shown in FIG. 4, some of the plurality of seal ring areas are first seal ring areas 108, the first seal ring areas 108 are located in first sub-TEG areas 106, and other of the plurality of seal ring areas are second seal ring areas 109, the second seal ring areas 109 are located in the second sub-TEG areas 107.

Specifically, besides the plurality of seal ring areas, each of the TEG areas further includes a plurality of test element set areas, and each of the TEG areas has an upper boundary and a lower boundary.

During the actual application, a first pattern file of the mask includes the final pattern of the mask, the first pattern file is a file in a graphic data system (GDS) format or in an office automation system (OAS) format, and the first pattern file includes all process parameters of the mask. According to the first pattern file in the GDS format or the OAS format, a mask factory acquires a second pattern file after a development process, and the second pattern file is a file in a manufacturing electron beam exposure system (MEBES) format. The development process can be a positive development or a negative development.

It should be noted that steps shown in the flowchart of the accompanying drawings can be executed, for example, in a computer system for a set of computer-executable instructions, and although a logical sequence is shown in the flowchart, in some cases, the steps shown or described can be executed in a sequence different from that stated herein.

The embodiment of the disclosure further provides an apparatus for correcting a mask pattern. It should be noted that the apparatus for correcting the mask pattern provided by the embodiment of the disclosure can be used to execute the method for correcting the mask pattern provided by the embodiment of the disclosure. The apparatus for correcting the mask pattern provided by the embodiment of the disclosure is described below.

Figure 5:
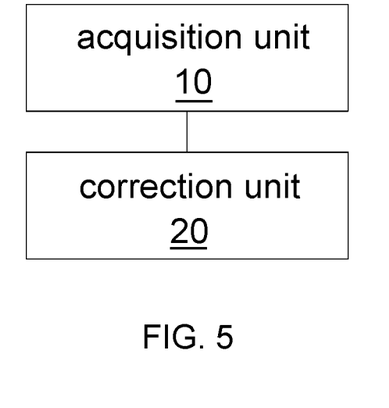
FIG. 5 shows a schematic diagram of an apparatus for correcting a mask pattern according to an embodiment of the disclosure.

FIG. 5 is a schematic diagram of the apparatus for correcting the mask pattern according to an embodiment of the disclosure. As shown in FIG. 5, the apparatus includes: an acquisition unit 10 and a correction unit 20, and the acquisition unit 10 is used for acquiring an initial pattern of a mask, as shown in FIG. 4, the initial pattern including a scribe line area 100 and die areas 102 which are spaced, and the scribe line area 100 is located between two adjacent die areas 102, each of the die areas 102 includes at least one die sub-area 104 and at least one first sub-test element group (TEG) area 106, and the scribe line area 100 includes scribe line sub-areas 105 and second sub-TEG areas 107, the first sub-TEG area 106 and the second sub-TEG area 107 are adjacent to each other, and the first sub-TEG area 106 and the second sub-TEG area 107 constitute a TEG area 101; and the correction unit 20 is used for performing an optical proximity correction on an area of the initial pattern excluding TEG areas 101, so as to acquire a final pattern.

In the apparatus for correcting the mask pattern, the initial pattern of the mask is firstly acquired through the acquisition unit, the initial pattern includes the scribe line area and the die areas which are spaced, and the scribe line area is located between the two adjacent die areas, each of the die areas includes the die sub-area and the first sub-TEG area, and the scribe line area includes the scribe line sub-area and the second sub-TEG area, the first sub-TEG area and the second sub-TEG area are adjacent to each other, and the first sub-TEG area and the second sub-TEG area constitute the TEG area, that is, the TEG area is separately adjacent to the die sub-area and the scribe line sub-area; and then the optical proximity correction is performed, through the correction unit, on the area of the initial pattern excluding the TEG areas, so as to acquire the final pattern. Compared with the implementations in which the OPC is separately performed on the die area and a frame, and then the die area and the frame which are subjected to the OPC are merged, which causes the problem that a joint between a merged scribe line and a merged die area has a slit, the apparatus of the disclosure does not perform the OPC on the TEG areas between die sub-areas and the scribe line sub-areas during the OPC on the initial pattern, such that extra polygon edges of corrected die sub-areas, and extra polygon edges of corrected scribe line sub-areas can both extend to the TEG areas, thus ensuring that the final pattern acquired after the OPC will be free of a slit, avoiding a problem of the slit on the mask produced after the OPC, and ensuring that the final pattern has a desirable effect, thereby ensuring that a photoresist pattern acquired after exposing and developing a wafer according to the final pattern has a desirable effect.

It should be noted that the scribe line area corresponds to a scribe line position on a wafer to be photoetched, the die area corresponds to a die position on the wafer, and the TEG area corresponds to a TEG pattern position on the wafer.

During an actual application, there are a large number of patterns needing the OPC in the die sub-area and the scribe line sub-area.

Figure 9:
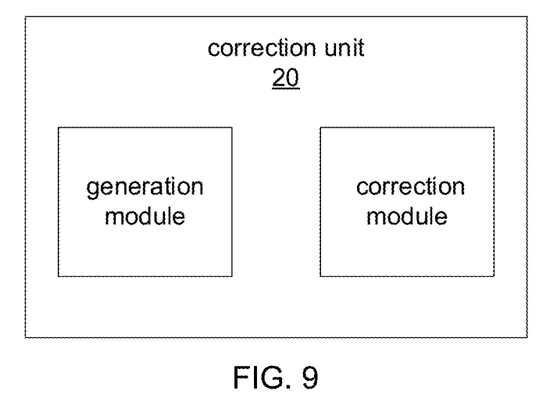
FIG. 9 shows a schematic diagram of a correction unit according to an embodiment of the disclosure.

In order to further ensure performing the optical proximity correction on the area of the initial pattern excluding the TEG areas simply and effectively, according to a specific embodiment of the disclosure, as shown in FIG. 9, the correction unit 20 includes a generation module and a correction module, and the generation module is used for generating a script for the optical proximity correction, and the script has a functions of identifying a boundary of each of the TEG areas and not performing the optical proximity correction on each of the TEG areas; and the correction module is used for performing the optical proximity correction on the initial pattern by the script, so as to acquire the final pattern. Through the script operation, the apparatus further ensures that the TEG areas are not corrected when the optical proximity correction is performed on the initial pattern, thereby further ensuring that the final pattern is free of the slit.

Figure 10:
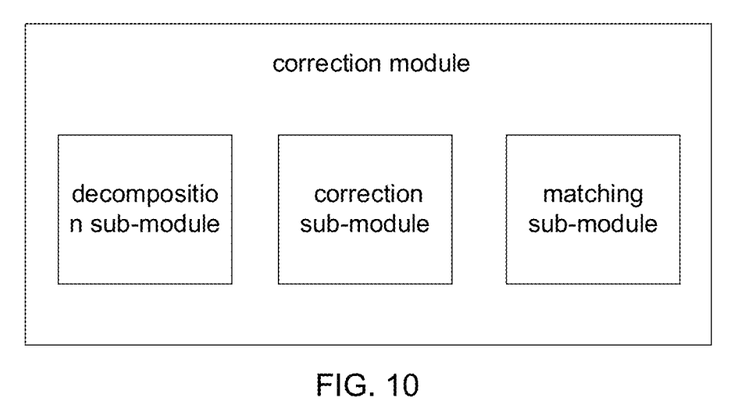
FIG. 10 shows a schematic diagram of a correction module according to an embodiment of the disclosure.

In another specific embodiment of the disclosure, as shown in FIG. 10, the correction module includes a decomposition sub-module, a correction sub-module and a matching sub-module, and the decomposition sub-module is used for decomposing the initial pattern into a plurality of first correction areas and a plurality of second correction areas by the script, and each of the plurality of first correction areas includes the die sub-area, each of the plurality of second correction areas includes the scribe line sub-area, and each of the plurality of first correction areas and each of the plurality of the second correction areas do not overlap; the correction sub-module is used for separately performing the optical proximity correction on the plurality of first correction areas and the plurality of second correction areas; and the matching sub-module is used for matching and merging a plurality of corrected first correction areas with a plurality of corrected second correction areas to acquire the final pattern.

Figure 11:
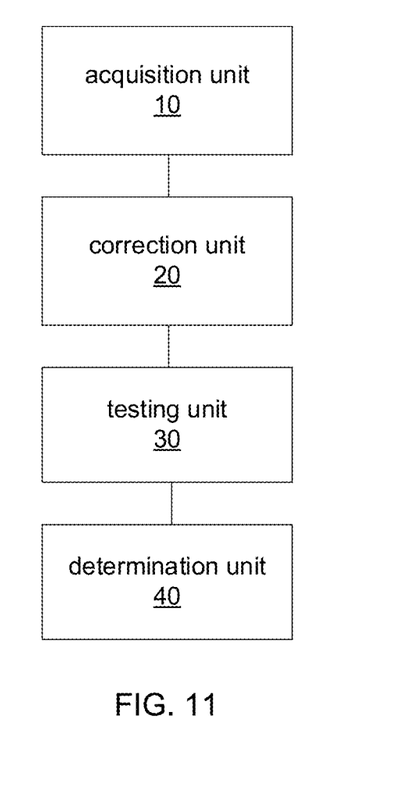
FIG. 11 shows a schematic diagram of an apparatus for correcting a mask pattern according to an embodiment of the disclosure.

In yet another specific embodiment of the disclosure, as shown in FIG. 11, the apparatus further includes a testing unit 30 and a determination unit 40, and the testing unit 30 is used for testing whether an overlap length of a boundary of each of a plurality of merged first correction areas and a boundary of each of a plurality of merged second correction areas is greater than or equal to a predetermined length after matching and merging the plurality of corrected first correction areas with the plurality of corrected second correction areas; and the determination unit 40 is used for determining that mergings succeed on a condition that the overlap length is greater than or equal to the predetermined length. According to the apparatus, by testing the overlap length of the boundary of each of the plurality of merged first correction areas and the boundary of each of the plurality of merged second correction areas correspondingly, merging effects of the plurality of corrected first correction areas and the plurality of corrected second correction areas are further monitored.

According to still another specific embodiment of the disclosure, the initial pattern further includes a plurality of seal ring areas, the plurality of seal ring areas are located in the TEG areas. The plurality of seal ring areas protect the die sub-areas and the scribe line sub-areas.

During the actual application, as shown in FIG. 4, some of the plurality of seal ring areas are first seal ring areas 108, the first seal ring areas 108 are located in first sub-TEG areas 106, and other of the plurality of seal ring areas are second seal ring areas 109, the second seal ring areas 109 are located in the second sub-TEG areas 107.

Specifically, besides the plurality of seal ring areas, each of the TEG areas further includes a plurality of test element set areas, and each of the TEG areas has an upper boundary and a lower boundary.

During the actual application, a first pattern file of the mask includes the final pattern of the mask, the first pattern file is a file in a graphic data system (GDS) format or in an office automation system (OAS) format, and the first pattern file includes all process parameters of the mask. According to the first pattern file in the GDS format or the OAS format, a mask factory acquires a second pattern file after a development process, and the second pattern file is a file in a manufacturing electron beam exposure system (MEBES) format. The development process can be a positive development or a negative development.

The apparatus for correcting the mask pattern includes a processor and a memory, and the acquisition unit, the correction unit, etc. are stored in the memory as program units, and the processor executes the program units stored in the memory to realize corresponding functions.

The processor contains a core, and the core calls the program units correspondingly in the memory. One or more cores can be set, and the problem of the slit on the mask produced after the OPC can be solved by adjusting parameters of the cores.

The memory can include at least one of a non-permanent memory, a random-access memory (RAM) and a nonvolatile memory, etc. in an computer readable medium, such as a read-only memory (ROM) or a flash RAM, and the memory includes at least one memory chip area.

The embodiment of the disclosure provides a computer readable storage medium, including a stored program, the stored program executing the method for correcting the mask pattern when executed by a processor.

The embodiment of the disclosure provides a processor, the processor is used for running a program, and the program executes the method for correcting the mask pattern when run.

The embodiment of the disclosure provides a device, the device includes a processor, a memory, and a program, and the program is stored in the memory and configured to be executed by the processor, and the processor executes, when executing the program, the at least following steps:

S101, an initial pattern of a mask is acquired, the initial pattern including a scribe line area and die areas which are spaced, and the scribe line area is located between two adjacent die areas, each of the die areas includes at least one die sub-area and at least one first sub-test element group (TEG) area, and the scribe line area includes scribe line sub-areas and second sub-TEG areas, the first sub-TEG area and the second sub-TEG area are adjacent to each other, and the first sub-TEG area and the second sub-TEG area constitute a TEG area; and S102, an optical proximity correction is performed on an area of the initial pattern excluding TEG areas, so as to acquire a final pattern.

The device in the specification can be a server, a personal computer (PC), a PAD, a mobile phone, etc.

The disclosure further provides a computer program product. When executed on a data processing device, the computer program product is applied to execute a program which is initialized to have at least the following method steps:

S101, an initial pattern of a mask is acquired, the initial pattern including a scribe line area and die areas which are spaced, and the scribe line area is located between two adjacent die areas, each of the die areas includes at least one die sub-area and at least one first sub-test element group (TEG) area, and the scribe line area includes scribe line sub-areas and second sub-TEG areas, the first sub-TEG area and the second sub-TEG area are adjacent to each other, and the first sub-TEG area and the second sub-TEG area constitute a TEG area; and S102, an optical proximity correction is performed on an area of the initial pattern excluding TEG areas, so as to acquire a final pattern.

According to yet another aspect of the embodiment of the disclosure, a method for manufacturing a semiconductor device is further provided. The method includes: a wafer to be processed is provided, and a structural layer of a surface of the wafer to be processed is a photoresist layer; a mask is placed on the photoresist layer to acquire a component to be exposed, and a pattern of the mask is acquired by any one of the method for correcting the mask pattern; the component to be exposed is exposed; and a exposed wafer is developed.

According to the method for manufacturing the semiconductor device, the wafer to be processed is firstly provided, and the structural layer of the surface of the wafer to be processed is the photoresist layer; then the mask is placed on the photoresist layer to acquire the component to be exposed, the pattern of the mask is acquired by any said correction method; finally the component to be exposed is exposed; and the exposed wafer is developed. The method uses any said correction method to acquire the pattern of the mask, and exposes and develops the wafer to be processed with the mask. Since the correction method does not perform OPC on a TEG area when performing the OPC on an initial pattern of the mask, the pattern acquired after the OPC will not produce a slit, thus avoiding a problem of the slit on the mask produced after the OPC, ensuring a desirable effect of a photoresist pattern of the wafer subjected to exposing and developing, and avoiding a slit pattern on the photoresist pattern.

In the above embodiments of the disclosure, descriptions of the embodiments have their own emphases. For a portion not detailed in certain embodiment, reference can be made to relevant descriptions of other embodiments.

It should be understood that in several embodiments provided by the disclosure, technical contents disclosed can be implemented in other manners. The apparatus embodiments described above are merely schematic. For example, unit division can be a logical function division and can have other division manners during actual implementation, for example, multiple units or components can be combined or integrated into another system, or some features can be ignored or not executed. Moreover, the coupling or direct coupling or communication connection with each other shown or discussed herein can be indirect coupling or communication connection through some interfaces, units or modules, and can be in electrical or other forms.

The units described as separated parts can or can not be physically separated, and the parts displayed as units can or can not be physical units, that is, they can be located in one place or distributed to multiple units. Some or all of the units can be selected according to actual needs to achieve the purpose of a solution of this embodiment.

In addition, functional units in the embodiments of the disclosure can be integrated into one processing unit, or each unit can be physically present separately, or two or more units can be integrated into one unit. The above integrated units can be implemented in the form of hardware, or can be implemented in the form of software functional units.

If the integrated units are implemented in the form of the software functional units and sold or used as independent products, they can be stored in a computer readable storage medium. Based on such understanding, a technical solution of the disclosure can be embodied in the form of software products in essence or in part that contributes to the prior art or in part or whole, the computer software products are stored in the storage medium, and include several instructions to make one piece of computer equipment (which can be a personal computer, a server, a network device, etc.) execute whole or partial steps of the method of each embodiment of the disclosure. The foregoing storage medium includes a USB flash drive, a read-only memory (ROM), a random-access memory (RAM), a mobile hard disk drive, a diskette or an optical disk, etc., which can store program codes.

From the above description, it can be seen that the above example of the disclosure achieves the following technical effects:

1). In the method for correcting the mask pattern of the disclosure, the initial pattern of the mask is firstly acquired, the initial pattern includes the scribe line area and the die areas which are spaced, and the scribe line area is located between the two adjacent die areas, each of the die areas includes the die sub-area and the first sub-TEG area, and the scribe line area includes the scribe line sub-area and the second sub-TEG area, the first sub-TEG area and the second sub-TEG area are adjacent to each other, and the first sub-TEG area and the second sub-TEG area constitute the TEG area, that is, the TEG area is separately adjacent to the die sub-area and the scribe line sub-area; and then the optical proximity correction is performed on the area of the initial pattern excluding the TEG areas, so as to acquire the final pattern. Compared with the implementations in which the OPC is separately performed on the die area and a frame, and then the die area and the frame which are subjected to the OPC are merged, which causes the problem that a joint between a merged scribe line and a merged die area has a slit, the method of the disclosure does not perform the OPC on the TEG areas between die sub-areas and the scribe line sub-areas during the OPC on the initial pattern, such that extra polygon edges of corrected die sub-areas, and extra polygon edges of corrected scribe line sub-areas can both extend to the TEG areas, thus ensuring that the final pattern acquired after the OPC will be free of a slit, avoiding a problem of the slit on the mask produced after the OPC, and ensuring that the final pattern has a desirable effect, thereby ensuring that a photoresist pattern acquired after exposing and developing a wafer according to the final pattern has a desirable effect.

2). In the apparatus for correcting the mask pattern, the initial pattern of the mask is firstly acquired through the acquisition unit, the initial pattern includes the scribe line area and the die areas which are spaced, and the scribe line area is located between the two adjacent die areas, each of the die areas includes the die sub-area and the first sub-TEG area, and the scribe line area includes the scribe line sub-area and the second sub-TEG area, the first sub-TEG area and the second sub-TEG area are adjacent to each other, and the first sub-TEG area and the second sub-TEG area constitute the TEG area, that is, the TEG area is separately adjacent to the die sub-area and the scribe line sub-area; and then the optical proximity correction is performed, through the correction unit, on the area of the initial pattern excluding the TEG areas, so as to acquire the final pattern. Compared with the implementations in which the OPC is separately performed on the die area and a frame, and then the die area and the frame which are subjected to the OPC are merged, which causes the problem that a joint between a merged scribe line and a merged die area has a slit, the apparatus of the disclosure does not perform the OPC on the TEG areas between die sub-areas and the scribe line sub-areas during the OPC on the initial pattern, such that extra polygon edges of corrected die sub-areas, and extra polygon edges of corrected scribe line sub-areas can both extend to the TEG areas, thus ensuring that the final pattern acquired after the OPC will be free of a slit, avoiding a problem of the slit on the mask produced after the OPC, and ensuring that the final pattern has a desirable effect, thereby ensuring that a photoresist pattern acquired after exposing and developing a wafer according to the final pattern has a desirable effect.

3). In the method for manufacturing the semiconductor device of the disclosure, the wafer to be processed is firstly provided, and the structural layer of the surface of the wafer to be processed is the photoresist layer; then the mask is placed on the photoresist layer to acquire the component to be exposed, the pattern of the mask is acquired by any said correction method; finally the component to be exposed is exposed; and the exposed wafer is developed. The method uses any said correction method to acquire the pattern of the mask, and exposes and develops the wafer to be processed with the mask. Since the correction method does not perform OPC on a TEG area when performing the OPC on an initial pattern of the mask, the pattern acquired after the OPC will not produce a slit, thus avoiding a problem of the slit on the mask produced after the OPC, ensuring a desirable effect of a photoresist pattern of the wafer subjected to exposing and developing, and avoiding a slit pattern on the photoresist pattern.

The above mentioned is merely a preferred embodiment of the disclosure and is not intended to limit the disclosure, and for a person of ordinary skill in the art, the disclosure can be variously modified and changed. Any modification, equivalent substitution and improvement, etc. made within the spirit and principles of the disclosure are intended to be included within the scope of protection of the disclosure.

What is claimed is:

1. A method for correcting a mask pattern, comprising:
   acquiring an initial pattern of a mask, the initial pattern comprising a scribe line area and die areas which are spaced, wherein the scribe line area is located between two adjacent die areas, each of the die areas comprises at least one die sub-area and at least one first sub-test element group (TEG) area, and the scribe line area comprises scribe line sub-areas and second sub-TEG areas, the first sub-TEG area and the second sub-TEG area are adjacent to each other, and the first sub-TEG area and the second sub-TEG area constitute a TEG area; and
   performing an optical proximity correction on an area of the initial pattern excluding TEG areas, so as to acquire a final pattern.

2. The method according to claim 1, wherein
said performing the optical proximity correction on the area of the initial pattern excluding the TEG areas comprises:
generating a script for the optical proximity correction, wherein the script has a function of identifying a boundary of each of the TEG areas and not performing the optical proximity correction on each of the TEG areas; and
performing the optical proximity correction on the initial pattern by the script, so as to acquire the final pattern.

3. The method according to claim 2, wherein
said performing the optical proximity correction on the initial pattern by the script, so as to acquire the final pattern comprises:
decomposing the initial pattern into a plurality of first correction areas and a plurality of second correction areas by the script, wherein each of the plurality of first correction areas comprises the die sub-area, each of the plurality of second correction areas comprises the scribe line sub-area, and each of the plurality of first correction areas and each of the plurality of second correction areas do not overlap;
separately performing the optical proximity correction on the plurality of first correction areas and the plurality of second correction areas; and
matching and merging a plurality of corrected first correction areas with a plurality of corrected second correction areas to acquire the final pattern.

4. The method according to claim 3, wherein
after matching and merging the plurality of corrected first correction areas with the plurality of corrected second correction areas, the method further comprises:
testing whether an overlap length of a boundary of each of a plurality of merged first correction areas and a boundary of each of a plurality of merged second correction areas correspondingly is greater than or equal to a predetermined length; and
determining mergings succeed on a condition that the overlap length is greater than or equal to the predetermined length.

5. The method according to claim 1, wherein
the initial pattern further comprises a plurality of seal ring areas which are spaced, the plurality of seal ring areas are located in the TEG areas.

6. The method according to claim 5, wherein
some of the plurality of seal ring areas are located in first sub-TEG areas, and other of the plurality of seal ring areas are located in the second sub-TEG areas.

7. A non-transitory computer-readable storage medium, comprising
a stored program, wherein the stored program, when executed by one or more processing circuits, implements the method of claim 1.

8. A processor configured to execute a program to implement the method of claim 1.

9. An electronic device, comprising
one or more processors, a memory, and one or more programs, wherein the one or more programs are stored in the memory and configured to be executed by the one or more processors to implement the method of claim 1.

10. An apparatus for correcting a mask pattern, comprising:
an acquisition unit used for acquiring an initial pattern of a mask, the initial pattern comprising a scribe line area and die areas which are spaced, wherein the scribe line area is located between two adjacent die areas, each of the die areas comprises at least one die sub-area and at least one first sub-test element group (TEG) area, and the scribe line area comprises scribe line sub-areas and second sub-TEG areas, the first sub-TEG area and the second sub-TEG area are adjacent to each other, and the first sub-TEG area and the second sub-TEG area constitute a TEG area; and
a correction unit used for performing an optical proximity correction on an area of the initial pattern excluding TEG areas, so as to acquire a final pattern.

11. The apparatus according to claim 10, wherein the correction unit comprises:
a generation module used for generating a script for the optical proximity correction, wherein the script has a function of identifying a boundary of each of the TEG areas and not performing the optical proximity correction on each of the TEG areas; and
a correction module used for performing the optical proximity correction on the initial pattern by the script, so as to acquire the final pattern.

12. The apparatus according to claim 11, wherein the correction module comprises:
a decomposition sub-module used for decomposing the initial pattern into a plurality of first correction areas and a plurality of second correction areas by the script, wherein each of the plurality of first correction areas comprises the die sub-area, each of the plurality of second correction areas comprises the scribe line sub-area, and each of the plurality of first correction areas and each of the plurality of second correction areas do not overlap;
a correction sub-module used for separately performing the optical proximity correction on the plurality of first correction areas and the plurality of second correction areas; and
a matching sub-module used for matching and merging a plurality of corrected first correction areas with a plurality of corrected second correction areas to acquire the final pattern.

13. The apparatus according to claim 12, further comprising:
a testing unit used for testing whether an overlap length of a boundary of each of a plurality of merged first correction areas and a boundary of each of a plurality of merged second correction areas correspondingly is greater than or equal to a predetermined length; and
a determination unit used for determining mergings succeed on a condition that the overlap length is greater than or equal to the predetermined length.

14. The apparatus according to claim 10, wherein the initial pattern further comprises a plurality of seal ring areas which are spaced, the plurality of seal ring areas are located in the TEG areas.

15. A method for manufacturing a semiconductor device, comprising:
providing a wafer to be processed, wherein a structural layer of a surface of the wafer to be processed is a photoresist layer;
placing a mask on the photoresist layer to acquire a component to be exposed, wherein a pattern of the mask is acquired with a process for correcting a mask pattern;
exposing the component to be exposed; and
developing an exposed wafer;
wherein the process for correcting the mask pattern comprises:
acquiring an initial pattern of a mask, the initial pattern comprising a scribe line area and die areas which are spaced, wherein the scribe line area is located between two adjacent die areas, each of the die areas comprises at least one die sub-area and at least one first sub-test element group (TEG) area, and the scribe line area comprises scribe line sub-areas and second sub-TEG areas, the first sub-TEG area and the second sub-TEG area are adjacent to each other, and the first sub-TEG area and the second sub-TEG area constitute a TEG area; and
performing an optical proximity correction on an area of the initial pattern excluding TEG areas, so as to acquire a final pattern.

16. The method according to claim 15, wherein said performing the optical proximity correction on the area of the initial pattern excluding the TEG areas comprises:
generating a script for the optical proximity correction, wherein the script has a function of identifying a boundary of each of the TEG areas and not performing the optical proximity correction on each of the TEG areas; and
performing the optical proximity correction on the initial pattern by the script, so as to acquire the final pattern.

17. The method according to claim 16, wherein after matching and merging the plurality of corrected first correction areas with the plurality of corrected second correction areas, the method further comprises:
testing whether an overlap length of a boundary of each of a plurality of merged first correction areas and a boundary of each of a plurality of merged second correction areas correspondingly is greater than or equal to a predetermined length; and
determining mergings succeed on a condition that the overlap length is greater than or equal to the predetermined length.

18. The method according to claim 15, wherein the initial pattern further comprises a plurality of seal ring areas which are spaced, the plurality of seal ring areas are located in the TEG areas.

19. The method according to claim 18, wherein some of the plurality of seal ring areas are located in first sub-TEG areas, and other of the plurality of seal ring areas are located in the second sub-TEG areas.

* * * * *